United States Patent [19]

Hladik et al.

[11] Patent Number: 5,721,745

[45] Date of Patent: Feb. 24, 1998

[54] PARALLEL CONCATENATED TAIL-BITING CONVOLUTIONAL CODE AND DECODER THEREFOR

[75] Inventors: Stephen Michael Hladik, Albany; John Bailey Anderson, Latham, both of N.Y.

[73] Assignee: General Electric Company, Schenectady, N.Y.

[21] Appl. No.: 636,732

[22] Filed: Apr. 19, 1996

[51] Int. Cl.[6] .......................... H03M 13/12; H03M 13/22
[52] U.S. Cl. ................................................ 371/43
[58] Field of Search .......................... 371/43, 44, 45, 371/46

[56] References Cited

U.S. PATENT DOCUMENTS

| | | | |
|---|---|---|---|
| 5,349,589 | 9/1994 | Chennakeshu et al. | 371/43 |
| 5,369,671 | 11/1994 | Yehushua et al. | 375/94 |
| 5,406,570 | 4/1995 | Berrou et al. | 371/43 |
| 5,446,747 | 8/1995 | Berrou | 371/45 |
| 5,577,053 | 11/1996 | Dent | 371/37.4 |

OTHER PUBLICATIONS

"Optimal Decoding of Linear Codes for Minimizing Symbol Error Rate, " LR Bahl, J. Cocke, F. Jelinek, J. Raviv, IEEE Transactions on Information Theory, pp. 284–287, Mar. 1974.

"Decision Depths of Convolutional Codes", J.B. Anderson, K. Balachandran, IEEE Transactions on Information Theory, vol. IT–35, pp. 455–459, Mar. 1989.

"An Efficient Adaptive Circular Vitebi Algorithm for Decoding Generalized Tailbiting Convolutional Codes," IEEE Transactions on Vehicular Technology, vol. 43, No. 1, pp. 57–68, Feb.1994.

"On Tail Biting Convolutional Codes, " HH Ma JK Wolf, IEEE Transactions on Communications, vol. 34, pp. 104–111, Feb. 1986.

"An Efficient Maximum Likelihood Decoding Algorithm for Generalized Tailbiting Convolutional Codes Including Quasicyclic Codes," Q. Wang, VK Bhargava, IEEE Transactions on Communications, vol. 37, No. 8, pp. 875–879, Aug. 1989.

"Near Shannon Limit Error—Correcting Coding and Decoding: Turbo–Codes," C. Berrou, A. Glavieux, P. Thitimajshima, Proc. of the IEEE Inter. Conf. on Comm., pp. 1064–1070, 1993.

"The TURBO Coding Scheme, " JD Anderson, Report IT–146 ISSN 0105–584, Institute of Telecommunication, Technical University of Denmark, Dec. 1994.

"Illuminating the Structure of Code and Decoder of Parallel Concatenated Recursive Systematic (Turbo) Codes," P. Robertson, 1994 IEEE Globecom Conference, pp. 1298–1303.

"Terminating the Trellis of Turbo–Codes," O. Joersson, H. Meyr, IEE Electronics Letters, vol. 30, No. 6, Aug. 4, 1994, pp. 1285–1286.

"A Viterbi Algorithm with Soft–Decision Outputs and its Applications," H. Hagenauer, P. Hoeher, 1989 IEEE Globecom Conference, pp. 1680–1686.

"Terminating the Trellis of Turbo–Codes in the Same State," AS Barbulescu, SS Pietrobon, IEE Electronics Letters, 1995, vol. 31, No. 1, Jan. 5, pp. 22–23.

"Source and Channel Coding —An Algorithmic Approach", JB Anderson, S. Mohan, pp.216 and 336–342.

Primary Examiner—Stephen M. Baker
Attorney, Agent, or Firm—Jill M. Breedlove; Marvin Snyder

[57] ABSTRACT

A parallel concatenated convolutional coding scheme utilizes tail-biting nonrecursive systematic convolutional codes. The associated decoder iteratively utilizes circular maximum a posteriori decoding to produce hard and soft decision outputs. This encoding/decoding system results in improved error-correction performance for short messages.

36 Claims, 5 Drawing Sheets

PARALLEL CONCATENATED TAIL-BITING CONVOLUTIONAL CODE AND DECODER THEREFOR

FIELD OF THE INVENTION

The present invention relates generally to error-correction coding for the communication of short messages over poor channels and, more particularly, to a parallel concatenated convolutional coding technique and a decoder therefor.

BACKGROUND OF THE INVENTION

One form of parallel concatenated coding, referred to as either parallel concatenated convolutional coding (PCCC) or "turbo coding", has been the subject of recent coding research due to impressive demonstrated coding gains when applied to blocks of 10,000 or more bits. (See C. Berrou, A. Glavieux and P. Thitimajshima, "Near Shannon Limit Error-Correcting Coding and Decoding: Turbo-Codes," *Proceedings of the IEEE International Conference on Communications*, 1993, pp. 1064–1070; J. D. Andersen, "The TURBO Coding Scheme," Report IT-146 ISSN 0105-854, Institute of Telecommunication, Technical University of Denmark, December 1994; and P. Robertson, "Illuminating the Structure of Code and Decoder of Parallel Concatenated Recursive Systematic (Turbo) Codes," 1994 *IEEE Globecom Conference*, pp. 1298–1303.)

However, it has been shown that the performance of a turbo code degrades substantially as the length of the encoded data block decreases. This effect is due to the strong dependence of its component recursive systematic convolutional codes' weight structures on block length. A second issue is the proper termination of message blocks applied to a turbo encoder. As described by O. Joerssen and H. Meyr in "Terminating the Trellis of Turbo-Codes," *IEE Electronics Letters*, vol. 30, no. 16, Aug. 4, 1994, pp. 1285–1286, the interleaving used in turbo encoders may make it impossible to terminate both the interleaved and non-interleaved encoder input sequences with a single set of tail bits. While it is possible to use a second tail sequence embedded into the message structure such that the encoder operating on the interleaved data sequence is properly terminated, this doubles the overhead associated with encoder termination and reduces the effective code rate. An alternative is not to terminate one of the encoder sequences, but this degrades performance of the encoder/decoder system, particularly when applied to short messages. In "Terminating the Trellis of Turbo-Codes in the Same State," *IEE Electronics Letters*, 1995, vol. 31, no. 1, January 5, pp. 22–23, A. S. Barbulescu and S. S. Pietrobon reported a method that places restrictions on the interleaver design in order to terminate two component recursive systematic convolutional (RSC) encoders with a single termination bit sequence. Their performance results show some degradation compared to performance obtained by terminating both encoders when an optimized interleaver is used. In addition, published bit-error rate (BER) versus energy-per-bit-to-noise-power-spectral-density ratio ($E_b/N_o$) data exhibit a flattening in BER over a range of $E_b/N_o$ values when RSCs are utilized in the turbo encoder.

Accordingly, it is desirable to provide an improved parallel concatenated coding technique for short data blocks.

SUMMARY OF THE INVENTION

In accordance with the present invention, a parallel concatenated convolutional coding scheme utilizes tail-biting nonrecursive systematic convolutional (NSC) codes. The associated decoder iteratively utilizes circular maximum a posteriori (MAP) decoding to produce hard and soft decision outputs. Use of tail-biting codes solves the problem of termination of the input data sequences in turbo coding, thereby avoiding associated decoder performance degradation for short messages. While NSC codes are generally weaker than recursive systematic convolutional (RSC) codes having the same memory asymptotically as the data block length increases, the free distance of a NSC code is less sensitive to data block length. Hence, parallel concatenated coding with NSC codes will perform better than with RSC codes having the same memory for messages that are shorter than some threshold data block size.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
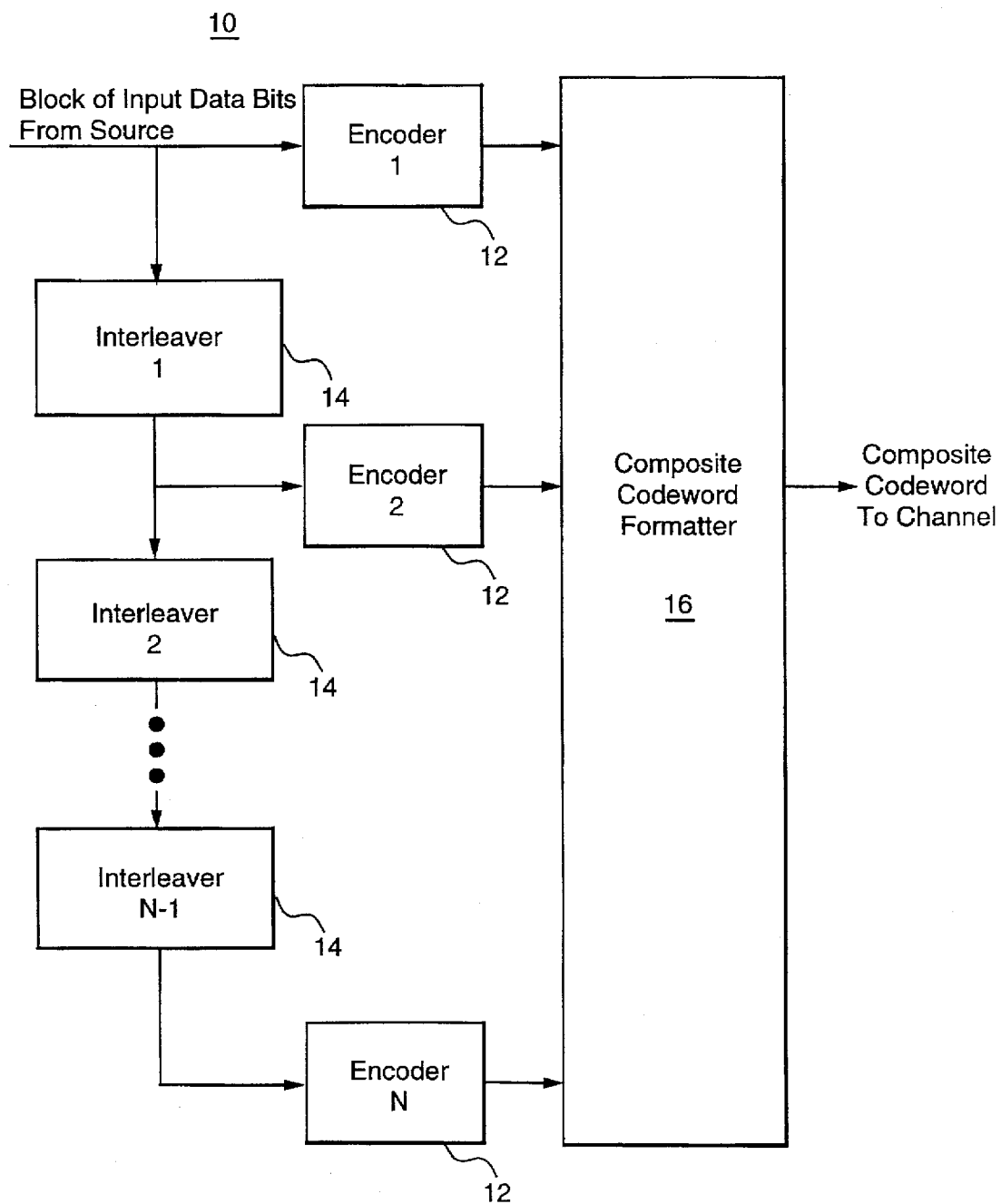
FIG. 1 is a simplified block diagram illustrating a parallel concatenated encoder.

FIG. 1 is a general block diagram of encoder signal processing 10 for parallel concatenated coding schemes. It comprises a plurality N of component encoders 12 which operate on blocks of data bits from a source. The data blocks are permuted by interleaving algorithms via interleavers 14. As shown, there are N−1 interleavers for N encoders 12. Finally, the component encoder outputs are combined into a single composite codeword by a composite codeword formatter 16. The composite codeword formatter is chosen to suit the characteristics of the channel, and it may be followed by a frame formatter chosen to suit the channel and communication system's channel access technique. The frame formatter may also insert other necessary overhead such as control bits and synchronization symbols.

A significant code rate advantage can be obtained in parallel concatenated coding if the component codes are systematic codes. The codewords (output) generated by a systematic encoder include the original data bits provided as inputs to the encoder and additional parity bits. (The redundancy introduced by the parity bits is what yields a code's error correction capability.) Therefore, when systematic encoders are used in the parallel concatenated encoder shown in FIG. 1, the codewords produced by all component encoders 12 contain the input data bits. If formatter 16 forms a data packet or composite codeword comprising only the parity bits generated by each component encoder 12 and the block of information bits to be coded, a substantial improvement in the rate of the composite parallel concatenated code is realized by eliminating repetition of the information bits in the transmitted composite codeword. For example, if component encoder 1 and component encoder 2 of a parallel concatenated convolutional code (PCCC) encoder comprising two component codes are both rate ½ codes, the composite parallel concatenated code rate is increased from ¼ for nonsystematic component codes to ⅓ when systematic component codes are used.

Parallel concatenated coding schemes which utilize recursive systematic convolutional (RSC) codes have been the recent topic of much research. These parallel concatenated convolutional codes (PCCC's) are also commonly known in the literature as "turbo" codes. As noted hereinabove, it has been demonstrated that these PCCC's can achieve impressive performance in terms of bit error rate (BER) versus the energy per bit to noise power spectral density ratio ($E_b/N_o$) for the case of relatively large messages, i.e., ten thousand or more bits. However, it has also been shown that the coding gain obtained with turbo codes degrades significantly with decreasing data block size because the recursive systematic convolutional component codes' strengths are quite sensitive to data block length. On the other hand, the performance of a nonrecursive systematic tail-biting convolutional code is independent of data block length for most practical purposes; the obtainable performance degrades only if the block of data bits encoded is less than a minimum size that is determined by the NSC's decision depth properties.

Figure 2:
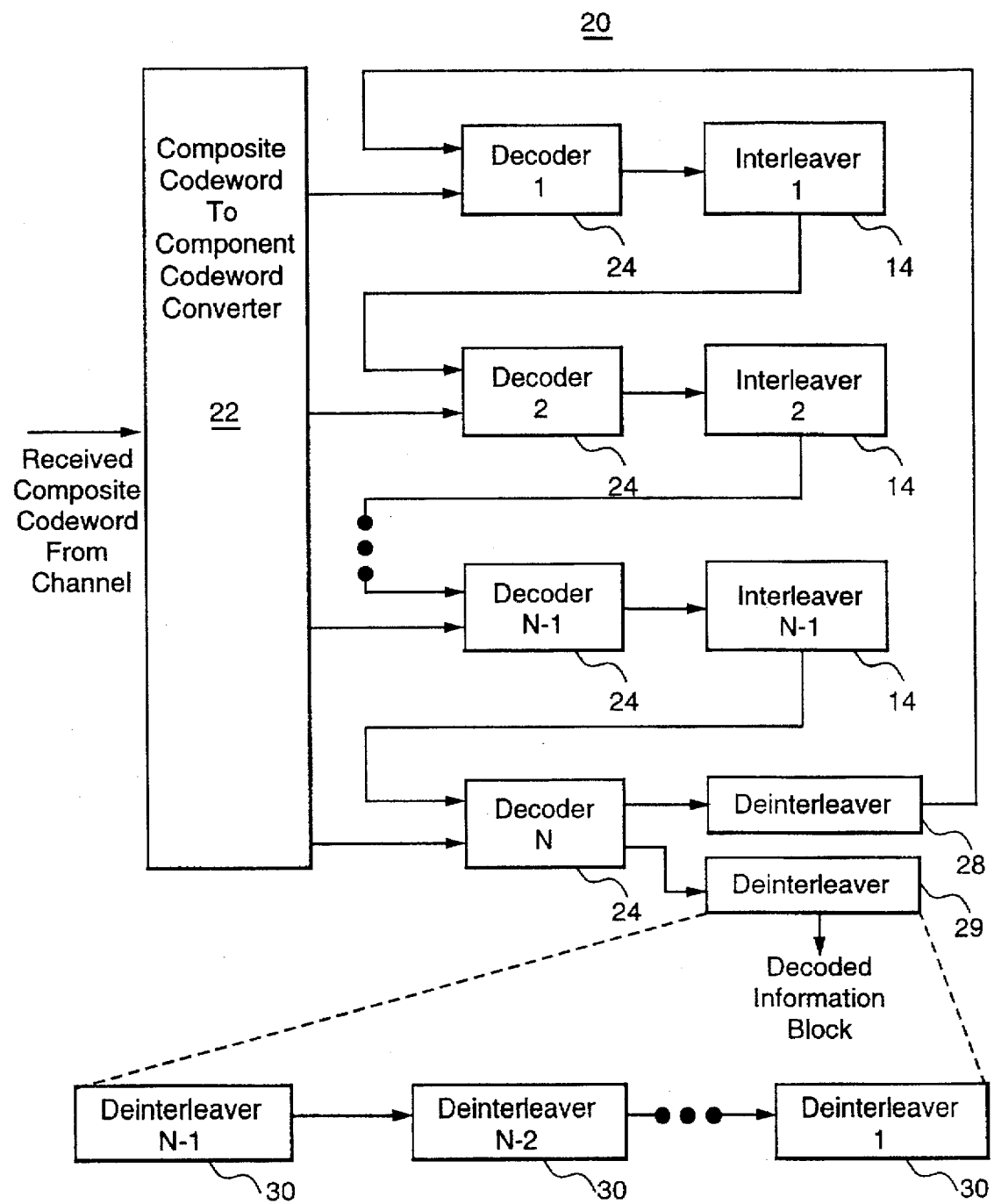
FIG. 2 is a simplified block diagram illustrating a decoder for parallel concatenated codes.

FIG. 2 illustrates a general decoder 20 for parallel concatenated codes in block diagram form. Decoder 20 comprises the following: a composite-codeword-to-component-codeword converter 22 which converts the composite codeword received from a channel to individual received codewords for each component decoder 24; N component decoders 24 corresponding to the N component encoders of FIG. 1; the same type (or same) interleavers 14 that are used in the parallel concatenated encoder (FIG. 1); and first and second deinterleavers 28 and 29, respectively, that each have a sequence reordering characteristic that is equivalent to a series concatenation of N−1 deinterleavers 30 corresponding to the N−1 interleavers used for encoding. The required ordering of these deinterleavers is shown in FIG. 2 and is the reverse of the ordering of the interleavers. The outputs of component decoders 24 are some type of soft-decision information on the estimated value of each data bit in the received codeword. For example, the outputs of the component decoders may be a first function of the probabilities that the decoded bits are 0 or 1 conditioned on the received sequence of symbols from the channel. One example of such a first function removes the influence of the conditional probability $P\{d_t^j=0/\frac{1}{2}(j)\}$ from a component decoder's soft-decision output that is inputted to a next sequential component decoder after an appropriate permutation, where $P\{d_t^j=0\ \frac{1}{2}(j)\}$ is the probability that the $j^{th}$ information bit at time t is 0 conditioned on the $j^{th}$ (systematic) bit of the received channel output symbol $Y_t$. Alternatively, the soft-decision information outputted by component decoders 24 may be a function of the likelihood ratio $$\Lambda(d_t^j) = \frac{P\{d_t^j=1/Y_1^L\}}{P\{d_t^j=0/Y_1^L\}} = \frac{1-P\{d_t^j=0/Y_1^L\}}{P\{d_t^j=0/Y_1^L\}},$$

or as a function of the log-likelikelihood ratio log $[\Lambda(d_t^j)]$. As shown, the $N^{th}$ component decoder has a second output, i.e., a second function of the conditional probabilities for the decoded bit values or likelihood ratios above. An example of this second function is the product of $P\{d_t^j=0/Y_t^L\}$ and the a priori probability that $d_t^j=0$ received from the previous component decoder.

The decoder for parallel concatenated codes operates iteratively in the following way. The first component decoder (decoder 1) calculates a set of soft-decision values for the sequence of information bits encoded by the first component encoder based on the received codeword and any a priori information about the transmitted information bits. In the first iteration, if there is no a priori information on the source statistics, it is assumed that the bits are equally likely to be 0 or 1(i.e., P{bit=0}=P{bit=1}=½). The soft-decision values calculated by decoder 1 are then interleaved using the same type (or same) interleaver that was used in the encoder to permute the block of data bits for the second encoder. These permuted soft-decision values and the corresponding received codeword comprise the inputs to the next component decoder (decoder 2). The permuted soft-decision values received from the preceding component decoder and interleaver are utilized by the next component decoder as a priori information about the data bits to be decoded. The component decoders operate sequentially in this manner until the $N^{th}$ decoder has calculated a set of soft-decision outputs for the block of data bits that was encoded by the encoder. The next step is deinterleaving soft-decision values from the $N^{th}$ decoder as described hereinabove. The first decoder then operates on the received codeword again using the new soft-decision values from the $N^{th}$ decoder as its a priori information. Decoder operation proceeds in this manner for the desired number of iterations. At the conclusion of the final iteration, the sequence of values which are a second function of the soft-decision outputs calculated by the $N^{th}$ decoder is deinterleaved in order to return the data to the order in which it was received by the PCCC encoder. The number of iterations can be a predetermined number, or it can be determined dynamically by detecting decoder convergence.

The decoder provides soft-decision information which is a function of the probability $P\{d_t^j=0/Y_t^L\}$; that is, the conditional probability that the $j^{th}$ data bit in a k-bit symbol input to the encoder at time t is 0 given that the set of channel outputs $Y_t^L=\{y_1, \ldots, y_L\}$ is received. In addition, the decoder may provide hard-decision information as a function of its soft-decision output through a decision device which implements a decision rule, such as:

$$P\{d_t^j = 0/Y_1^L\} \begin{array}{c} \hat{d}_t^j = 0 \\ > \\ < \\ \hat{d}_t^j = 1 \end{array} \frac{1}{2};$$

That is, if $P\{d_t^j=0/Y_t^L\}>½$, then $\hat{d}_t^j=0$; if $P\{d_t^j=0/Y_t^L\}<½$, then $\hat{d}_t^j=1$; otherwise, randomly assign $d_t^j$ the value 0 or 1.

Typical turbo decoders utilize either maximum a posteriori (MAP) decoders, such as described by L. R. Bahl, J. Cocke, F. Jelinek and J. Raviv in "Optimal Decoding of Linear Codes for Minimizing Symbol error Rate," *IEEE Transactions of Information Theory*, March 1974, pp. 284–287, or soft output Viterbi algorithm (SOVA) decoders, as described by J. Hagenauer and P. Hoeher in "A Viterbi Algorithm with Soft-Decision Outputs and its Applications," 1989 *IEEE Globecom Conference*, pp. 1680–1686. A MAP decoder produces the probability that a decoded bit value is 0 or 1. On the other hand, a SOVA decoder typically calculates the likelihood ratio for each decoded bit. It is apparent that this likelihood ratio can be obtained from P{decoded bit is 0} and vice versa using P{decoded bit is 0}=1−P−(decoded bit is 1}. Some computational advantage has been found when either MAP or SOVA decoders work with the logarithm of likelihood ratios, that is, $$\log\left(\frac{P\{\text{decoded bit is 1}\}}{P\{\text{decoded bit is 0}\}}\right).$$

It has been demonstrated that the coding gain (error correction capability) obtained with turbo codes degrades significantly with decreasing data block size. Several authors have attributed this behavior primarily to the properties of RSC codes. It has been shown that the distance property of a RSC code increases with increasing data block length. Conversely, the minimum distance of a RSC code decreases with decreasing data block length. A second problem is the difficulty in terminating all RSC codes comprising a turbo coding scheme due to interleaving. Disadvantageously, the adverse effects resulting from a lack of sequence termination or the imposition of restrictions on interleaver design are significant and become even more so with decreasing data block length.

In accordance with the present invention, the component codes in a parallel concatenated convolutional coding scheme comprise tail-biting nonrecursive systematic convolutional codes. The use of such tail-biting codes solves the problem of termination of the input data sequences in turbo coding, thereby avoiding decoder performance degradation for short messages. Although NSC codes are generally weaker than RSC codes having the same memory, the free distance of a NSC code is less sensitive to data block length. Hence, parallel concatenated coding with NSC codes will perform better than with RSC codes having the same memory for messages that are shorter than a predetermined threshold data block size. The performance cross-over point is a function of desired decoded bit error rate, code rate, and code memory.

Figure 3:
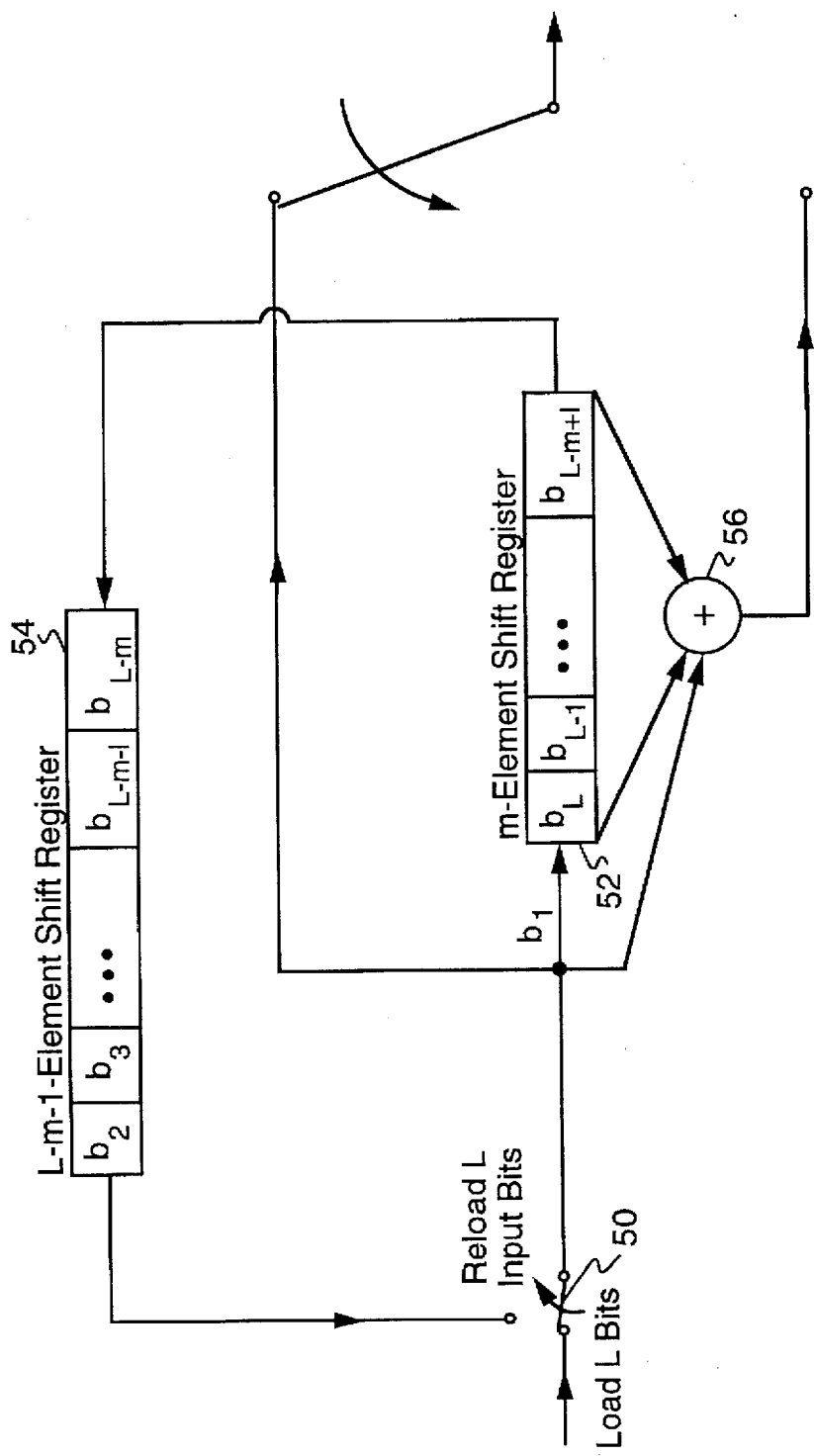
FIG. 3 is a simplified block diagram illustrating a tail-biting, nonrecursive systematic convolutional encoder for use in the coding scheme according to the present invention.

FIG. 3 illustrates an example of rate=½,memory=m tail-biting nonrecursive systematic convolutional encoder for use in the parallel concatenated convolutional coding (PCCC) scheme of the present invention. For purposes of description, an (n, k, m) encoder denotes and encoder wherein the input symbols comprise k bits, the output symbols comprise n bits, and m=encoder memory in k-bit symbols. For purposes of illustration, FIG. 3 is drawn for binary input symbols, i.e., k=1. However, the present invention is applicable to any values of k, n, and m.

Initially, a switch 50 is in the down position, and L input bits are shifted into a shift register 52, k at a time (one input symbol at a time for this example). After loading the $L^{th}$ bit into the encoder, the switch moves to the up position and encoding begins with the shift of the first bit from a second shift register 54 into the nonrecursive systematic encoder; the state of the encoder at this time is $\{b_L, b_{L-1}, \ldots, b_{L-(km-1)}\}$. In this example, the encoder output comprises the current input bit and a parity bit formed in block 56 (shown as modulo 2 addition for this example) as a function of the encoder state and the current input symbol. Encoding ends when the Lth bit is encoded.

Another aspect of the present invention, the associated decoder for the hereinabove described parallel concatenated encoder, comprises a circular MAP decoder as described by the present inventors in commonly assigned, copending U.S. patent application No. (RD-24,923), which is incorporated by reference herein. In particular, U.S. patent application No. (RD-24,923) describes a circular MAP decoder useful for decoding tail-biting convolutional codes. The circular MAP decoder can deliver both an estimate of the encoded data block and reliability information to a data sink, e.g., a speech synthesis signal processor for use in transmission error concealment or protocol processor for packet data as a measure of block error probability for use in repeat request decisions.

In particular, as described in U.S. patent application No. (RD-24,923), a circular MAP decoder for error-correcting trellis codes that employ tail biting produces soft-decision outputs. The circular MAP decoder provides an estimate of the probabilities of the states in the first stage of the trellis, which probabilities replace the a priori knowledge of the starting state in a conventional MAP decoder. The circular MAP decoder provides the initial state probability distribution in either of two ways. The first involves a solution to an eigenvalue problem for which the resulting eigenvector is the desired initial state probability distribution; with knowledge of the starting state, the circular MAP decoder performs the rest of the decoding according to the conventional MAP decoding algorithm. The second is based on a recursion for which the iterations converge to a starting state distribution. After sufficient iterations, a state on the circular sequence of states is known with high probability, and the circular MAP decoder performs the rest of the decoding according to the conventional MAP decoding algorithm.

The objective of the conventional MAP decoding algorithm is to find the conditional probabilities:

P{state m at time t / receive channel outputs $y_1, \ldots, y_L$}.

The term L in this expression represents the length of the data block in units of the number of encoder symbols. (The encoder for an (n, k) code operates on k-bit input symbols to generate n-bit output symbols.) The term $y_t$ is the channel output (symbol) at time t.

The MAP decoding algorithm actually first finds the probabilities:

$$\lambda_t(m) = P\{S_t = m; Y_1^L\}; \tag{1}$$

that is, the joint probability that the encoder state at time t, $S_t$, is m and the set of channel outputs $Y_1^L = \{y_1, \ldots, y_L\}$ is received. These are the desired probabilities multiplied by a constant (P{$Y_1^L$}, the probability of receiving the set of channel outputs $\{y_1, \ldots, y_L\}$).

Now define the elements of a matrix $\Gamma_t$ by $\Gamma_t(i,j) = P\{\text{state } j \text{ at time } t; y_t/\text{state } i \text{ at time } t-1.\}$ The matrix $\Gamma_t$ is calculated as a function of the channel transition probability $R(Y_t, X)$, the probability $p_t(m/m')$ that the encoder makes a transition from state m' to m at time t, and the probability $q_t(X/m',m)$ that the encoder's output symbol is X given that the previous encoder state is m' and the present encoder state is m. In particular, each element of $\Gamma_t$ is calculated by summing over all possible encoder outputs X as follows:

$$\gamma_t(m', m) = \sum_X p_t(m/m') q_t(X/m', m) R(Y_t, X). \tag{2}$$

The MAP decoder calculates L of these matrices, one for each trellis stage. They are formed from the received channel output symbols and the nature of the trellis branches for a given code.

Next define the M joint probability elements of a row vector $\alpha_t$ by $$\alpha_t(j) = P\{\text{state } j \text{ at time } t; y_1, \ldots, y_t\} \quad (3)$$

and the M conditional probability elements of a column vector $\beta_t$ by $$\beta_t(j) = P\{y_{t+1}, \ldots y_L/\text{state } j \text{ at time } t\} \quad (4)$$

for $j=0,1,\ldots,(M-1)$ where M is the number of encoder states. (Note that matrices and vectors are denoted herein by using boldface type.)

The steps of the MAP decoding algorithm are as follows:
(i) Calculate $\alpha_1, \ldots, \alpha_L$ by the forward recursion:

$$\alpha_t = \alpha_{t-1} \Gamma_t, \ t=1, \ldots, L \quad (5)$$

(ii) Calculate $\beta_1, \ldots, \beta_{L-1}$ by the backward recursion:

$$\beta_t = \Gamma_{t+1} \beta_{t+1}, \ t=L-1, \ldots, 1. \quad (6)$$

(iii) Calculate the elements of $\lambda_t$ by:

$$\lambda_t(i) = \alpha_t(i) \beta_t(i), \text{ all } i, \ t=1, \ldots L. \quad (7)$$

(iv) Find related quantities as needed. For example, let $A_t^j$ be the set of states $S_t = \{S_t^1, S_t^2, \ldots, S_t^{km}\}$ such that the $j^{th}$ element of $S_t$, $S_t^j$ is equal to zero. For a conventional non-recursive trellis code, $S_t^j = d_t^j$, the $j^{th}$ data bit at time t. Therefore, the decoders soft-decision output is $$P\{d_t^j = 0/Y_1^L\} = \frac{1}{P\{Y_1^L\}} \sum_{S_t \in A_t^j} \lambda_t(m)$$

where $$P\{Y_1^L\} = \sum_m \lambda_L(m)$$

and m is the index that corresponds to a state $S_t$.

The decoder's hard-decision or decoded bit output is obtained by applying $P\{d_t^j = 0/Y_1^L\}$ to the following decision rule:

$$P\{d_t^j = 0/Y_1^L\} \begin{array}{c} \hat{d}_t^j = 0 \\ > \\ < \\ \hat{d}_t^j = 1 \end{array} \frac{1}{2} \ ;$$

That is, if $P\{d_t^j = 0/Y_1^L\} < \frac{1}{2}$, then $\hat{d}_t^j = 0$; if $P\{d_t^j = 0/Y_1^L\} < \frac{1}{2}$, then $\hat{d}_t^j = 1$; otherwise, randomly assign $d_t^j$ the value 0 or 1. As another example of a related quantity for step (iv) hereinabove, the matrix of probabilities $\sigma_t$ comprises elements defined as follows:

$$\sigma_t(i,j) = P\{S_{t-1} = i; S_t = j; Y_1^L\} = \alpha_{t-1}(i) \gamma_t(i,j) \beta_t(j) \quad (i)$$

These probabilities are useful when it is desired to determine the a posteriori probability of the encoder output bits.

In the standard application of the MAP decoding algorithm, the forward recursion is initialized by the vector $\alpha_0 = (1,0,\ldots 0)$, and the backward recursion is initialized by $\beta_L = (1,0,\ldots 0)^T$. These initial conditions are based on assumptions that the encoder's initial state $S_0 = 0$ and its ending state $S_L = 0$.

One embodiment of the circular MAP decoder determines the initial state probability distribution by solving an eigenvalue problem as follows. Let $\alpha_t, \beta_t, \Gamma_t,$ and $\lambda_t$ be as before, but take the initial $\alpha_0$ and $\beta_L$ as follows:

Set $\beta_L$ to the column vector $(111 \ldots 1)^T$.
Let $\alpha_O$ be an unknown (vector) variable.
Then,
(i) Calculate $\Gamma_t$ for $t=1, 2, \ldots L$ according to equation (2).
(ii) Find the largest eigenvalue of the matrix product $\Gamma_1 \Gamma_2 \ldots \Gamma_L$. Normalize the corresponding eigenvector so that its components sum to unity. This vector is the solution for $\alpha_O$. The eigenvalue is $P\{Y_1^L\}$.
(iii) Form the succeeding $\alpha_t$ by the forward recursion set forth in equation (5).
(iv) Starting from $\beta_L$, initialized as above, form the $\beta_t$ by the backward recursion set forth in equation (6).
(v) Form the $\lambda_t$ as in (7), as well as other desired variables, such as, for example, the soft-decision output $P\{d_t^j = 0/Y_1^L\}$ or the matrix of probabilities $\sigma_t$, described hereinabove.

The inventors have shown that the unknown variable $\alpha_O$ satisfies the matrix equation $$a_0 = \frac{a_0 \Gamma_1 \Gamma_2 \ldots \Gamma_L}{P\{Y_1^L\}} \ .$$

From the fact that this formula expresses a relationship among probabilities, we know that the product of $\Gamma_t$ matrices on the right has largest eigenvalue equal to $P\{Y_1^L\}$, and that the corresponding eigenvector must be a probability vector.

With the initial $\beta_L = (111 \ldots 1)^T$, equation (6) gives $\beta_{L-1}$. Thus, repeated applications of this backward recursion give all the $\beta_t$. Once $\alpha_O$ is known and $\beta_L$ is set, all computations in the circular MAP decoder of the present invention follow the conventional MAP decoding algorithm.

Figure 4:
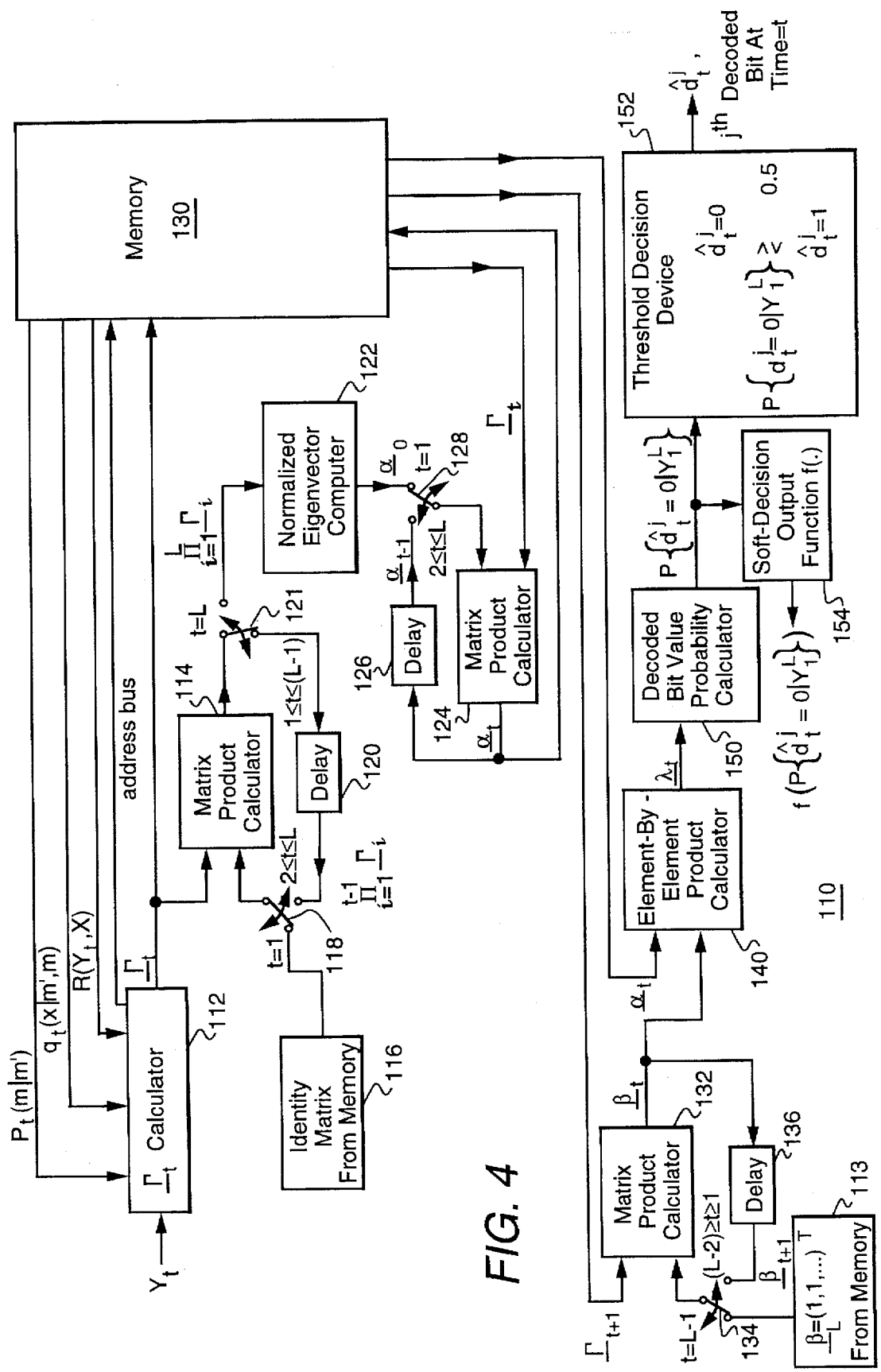
FIG. 4 is a simplified block diagram illustrating a circular MAP decoder useful as a component decoder in a decoder for a parallel concatenated convolutional coding scheme according to the present invention.

FIG. 4 is a simplified block diagram illustrating a circular MAP decoder 110 for decoding an error-correcting tail-biting trellis code in accordance with the eigenvector method described hereinabove. Decoder 110 comprises a $\Gamma_t$ calculator 112 which calculates $\Gamma_t$ as a function of the channel output $y_t$. The $\Gamma_t$ calculator receives as inputs the following from a memory 130: the channel transition probability $R(Y_t, X)$, the probability $p_t(m/m')$ that the encoder makes a transition from state m' to m at time t, and the probability $q_t(X/m',m)$ that the encoder's output symbol is X given that the previous encoder state is m' and the present encoder state is m. The $\Gamma_t$ calculator calculates each element of $\Gamma_t$ by summing over all possible encoder outputs X in accordance with equation (2).

The calculated values of $\Gamma_t$ are provided to a matrix product calculator 114 to form the matrix product $\Gamma_1 \Gamma_2 \ldots \Gamma_L$ using an identity matrix 116, e.g., received from memory, a switch 118 and a delay circuit 120. At time t=1, the identity matrix is applied as one input to the matrix product calculator. For each subsequent time from t=2 to t=L, the matrix product $$\prod_{i=1}^{t-1} \Gamma_i$$

gets fed back via the delay circuit to the matrix product calculator. Then, at time t=L, the resulting matrix product is provided via a switch 121 to a normalized eigenvector computer 122 which calculates the normalized eigenvector corresponding to the largest eigenvalue of the matrix product input thereto. With $\alpha_O$ thus initialized, i.e., as this normalized eigenvector, the succeeding $\alpha_t$ vectors are determined recursively according to equation (5) in a matrix product calculator 124 using a delay 126 and switch 128 circuitry, as shown. Appropriate values of $\Gamma_t$ are retrieved from a memory 130, and the resulting $\alpha_t$ are then stored in memory 130.

The values of $\beta_t$ are determined in a matrix product calculator 132 using a switch 134 and delay 136 circuitry according to equation (6). Then, the probabilities $\lambda_t$ are calculated from the values of $\alpha_t$ and $\beta_t$ in an element-by-element product calculator 140 according to equation (7). The values of $\lambda_t$ are provided to a decoded bit value probability calculator 150 which determines the probability that the $j^{th}$ decoded bit at time t, $d_t^j$, equals zero. This probability is provided to a threshold decision device 152 which implements the following decision rule: If the probability from calculator 150 is greater than ½, then decide that the decoded bit is zero; if the probability is less than ½, then decide that the decoded bit is one; if it equals ½, then the decoded bit is randomly assigned the value 0 or 1. The output of the threshold decision device is the decoder's output bit at time t.

The probability that the decoded bit equals zero $P\{d_t^j=0/Y_1^j\}$ is also shown in FIG. 4 as being provided to a soft output function block 154 for providing a function of the probability, i.e., $f(P\{d_t^j=0/Y_1^j\})$, such as, for example, the $$\text{likelihood ratio} = \frac{1 - P\{d_t^j = 0/Y_1^j\}}{P\{d_t^j = 0/Y_1^j\}}$$

as the decoder's soft-decision output. Another useful function of $P\{d_t^j=0/Y_1^j\}$ is the $$\text{log likelihood ratio} = \log \left\{ \frac{1 - P\{d_t^j = 0/Y_1^j\}}{P\{d_t^j = 0/Y_1^j\}} \right\}.$$

Alternatively, a useful function for block 154 may simply be the identity function so that the soft output is just $P\{d_t^j=0/Y_1^j\}$.

An alternative embodiment of the circular MAP decoder determines the state probability distributions by a recursion method. In particular, in one embodiment (the dynamic convergence method), the recursion continues until decoder convergence is detected. In this recursion (or dynamic convergence) method, steps (ii) and (iii) of the eigenvector method described hereinabove are replaced as follows:

(ii.a) Starting with an initial $\alpha_0$ equal to (1/M, . . . , 1/M), where M is the number of states in the trellis, calculate the forward recursion L times. Normalize the results so that the elements of each new $\alpha_t$ sum to unity. Retain all L $\alpha_t$ vectors.

(ii.b) Let $\alpha_0$ equal $\alpha_L$ from the previous step and, starting at t=1, calculate the first $L_{w_{min}}$ $\alpha_t$ probability vectors again. That is, calculate $$\alpha_t(m) = \sum_{i=0}^{M-1} \alpha_{t-1} \gamma_i(i, m)$$

for m=0, 1, . . . , M−1 and t=1,2, . . . , $L_{w_{min}}$ where $L_{w_{min}}$ is a suitable minimum number of trellis stages.

Normalize as before. Retain only the most recent set of L $\alpha$'s found by the recursion in steps (ii.a) and (ii.b) and the $$\alpha_{L_{w_{min}}}$$

found previously in step (ii.a).

(ii.c) Compare $$\alpha_{L_{w_{min}}}$$

from step (ii.b) to the previously found set from step (ii.a). If the M corresponding elements of the new and old $$\alpha_{L_{w_{min}}}$$

are within a tolerance range, proceed to step (iv) set forth hereinabove. Otherwise, continue to step (ii.d).

(ii.d) Let t=t+1 and calculate $\alpha_t=\alpha_{t-1}\Gamma_t$. Normalize as before. Retain only the most recent set of L $\alpha$'s calculated and the $\alpha_t$ found previously in step (ii.a).

(ii.e) Compare the new $\alpha_t$'s to the previously found set. If the M new and old $\alpha_t$'s are within a tolerance range, proceed to step (iv). Otherwise, continue with step (ii.d) if the two most recent vectors do not agree to within the tolerance range and if the number of recursions does not exceed a specified maximum (typically 2 L); proceeding to step (iv) otherwise.

This method then continues with steps (iv) and (v) given hereinabove with respect to the eigenvector method to produce the soft-decision outputs and decoded output bits of the circular MAP decoder.

In another alternative embodiment of the circular MAP decoder as described in U.S. patent application No. (RD-24,923), the recursion method described hereinabove is modified so that the decoder only needs to process a predetermined, fixed number of trellis stages for a second time, that is, a predetermined wrap depth. This is advantageous for implementation purposes because the number of computations required for decoding is the same for every encoded message block. Consequently, hardware and software complexities are reduced.

One way to estimate the required wrap depth for MAP decoding of a tail-biting convolutional code is to determine it from hardware or software experimentation, requiring that a circular MAP decoder with a variable wrap depth be implemented and experiments be conducted to measure the decoded bit error rate versus $E_b/N_o$ for successively increasing wrap depths. The minimum decoder wrap depth that provides the minimum probability of decoded bit error for a specified $E_b/N_o$ is found when further increases in wrap depth do not decrease the error probability.

If a decoded bit error rate that is greater than the minimum achievable at a specified $E_b/N_o$ is tolerable, it is possible to reduce the required number of trellis stages processed by the circular MAP decoder. In particular, the wrap depth search described hereinabove may simply be terminated when the desired average probability of bit error is obtained.

Another way to determine the wrap depth for a given code is by using the code's distance properties. To this end, it is necessary to define two distinct decoder decision depths. As used herein, the term "correct path" refers to the sequence of states or a path through the trellis that results from encoding a block of data bits. The term "incorrect subset of a node" refers to the set of all incorrect (trellis) branches out of a correct path node and their descendents. Both the decision depths defined below depend on the convolutional encoder.

The decision depths are defined as follows:

(i) Define the forward decision depth for e-error correction, LF(e), to be the first depth in the trellis at which all paths in the incorrect subset of a correct path initial node, whether later merging to the correct path or not, lie more than a Hamming distance 2e from the correct path. The significance of LF(e) is that if there are e or fewer errors forward of the initial node, and encoding is known to have begun there, then the decoder must decode correctly. A formal tabulation of forward decision depths for convolutional codes was provided by J. B. Anderson and K. Balachandran in "Decision Depths of Convolutional Codes", *IEEE Transactions on Information Theory*, vol. IT-35, pp. 455–59, March 1989. A number of properties of LF(e) are disclosed in this reference and also by J. B. Anderson and S. Mohan in *Source and Channel Coding—An Algorithmic Approach*, Kluwer Academic Publishers, Norwell, Me., 1991. Chief among these properties is that a simple linear relation exists between LF and e; for example, with rate ½ codes, LF is approximately 9.08e.

(ii) Next define the unmerged decision depth for e-error correction, LU(e), to be the first depth in the trellis at which all paths in the trellis that never touch the correct path lie more than a Hamming distance of 2e away from the correct path.

The significance of LU(e) for soft-decision circular MAP decoding is that the probability of identifying a state on the actual transmitted path is high after the decoder processes LU(e) trellis stages. Therefore, the minimum wrap depth for circular MAP decoding is LU(e). Calculations of the depth LU(e) show that it is always larger than LF(e) but that it obeys the same approximate law. This implies that the minimum wrap depth can be estimated as the forward decision depth LF(e) if the unmerged decision depth of a code is not known.

By finding the minimum unmerged decision depth for a given encoder, we find the fewest number of trellis stages that must be processed by a practical circular decoder that generates soft-decision outputs. An algorithm to find LF(e), the forward decision depth, was given by J. B. Anderson and K. Balachandran in "Decision Depths of Convolutional Codes", cited hereinabove. To find LU(e):

(i) Extend the code trellis from left to right, starting from all trellis nodes simultaneously, except for the zero-state.

(ii) At each level, delete any paths that merge to the correct (all-zero) path; do not extend any paths out of the correct (zero) state node.

(iii) At level k, find the least Hamming distance, or weight, among paths terminating at nodes at this level.

(iv) If this least distance exceeds 2e, stop. Then, LU(e)=k.

As described in U.S. patent application No. (RD-24,923), experimentation via computer simulation lead to two unexpected results: (1) wrapped processing of $\beta_t$ improves decoder performance; and (2) the use of a wrap depth of LU(e)+LF(e)=2 LF(e) improves performance significantly. Hence, a preferred embodiment of the circular MAP decoder algorithm based on recursion comprises the following steps:

(i) Calculate $\Gamma_t$ for t=1, 2, ... L according to equation (2).

(ii) Starting with an initial $\alpha_0$ equal to (1/M, ..., 1/M), where M is the number of states in the trellis, calculate the forward recursion of equation (5) (L+$L_w$) times for u=1, 2, ... (L+$L_w$) where $L_w$ is the decoder's wrap depth. The trellis-level index t takes on the values ((u−1) mod L)+1. When the decoder wraps around the received sequence of symbols from the channel, $\alpha_L$ is treated as $\alpha_0$. Normalize the results so that the elements of each new $\alpha_t$ sum to unity. Retain the L most recent $\alpha$ vectors found via this recursion.

(iii) Starting with an initial $\beta_L$ equal to (1, ..., 1)$^T$, calculate the backward recursion of equation (6) (L+$L_w$) times for u=1, 2, ... (L+$L_w$). The trellis-level index t takes on the values L-(u mod L). When the decoder wraps around the received sequence, $\beta_1$ is used as $\beta_{L+1}$ and $\Gamma_1$ is used as $\Gamma_{L+1}$ when calculating the new $\beta_L$. Normalize the results so that the elements of each new $\beta_t$ sum to unity. Again, retain the L most recent $\beta$ vectors found via this recursion.

The next step of this preferred recursion method is the same as step (v) set forth hereinabove with respect to the eigenvector method to produce the soft-decisions and decoded bits output by the circular MAP decoder.

Figure 5:
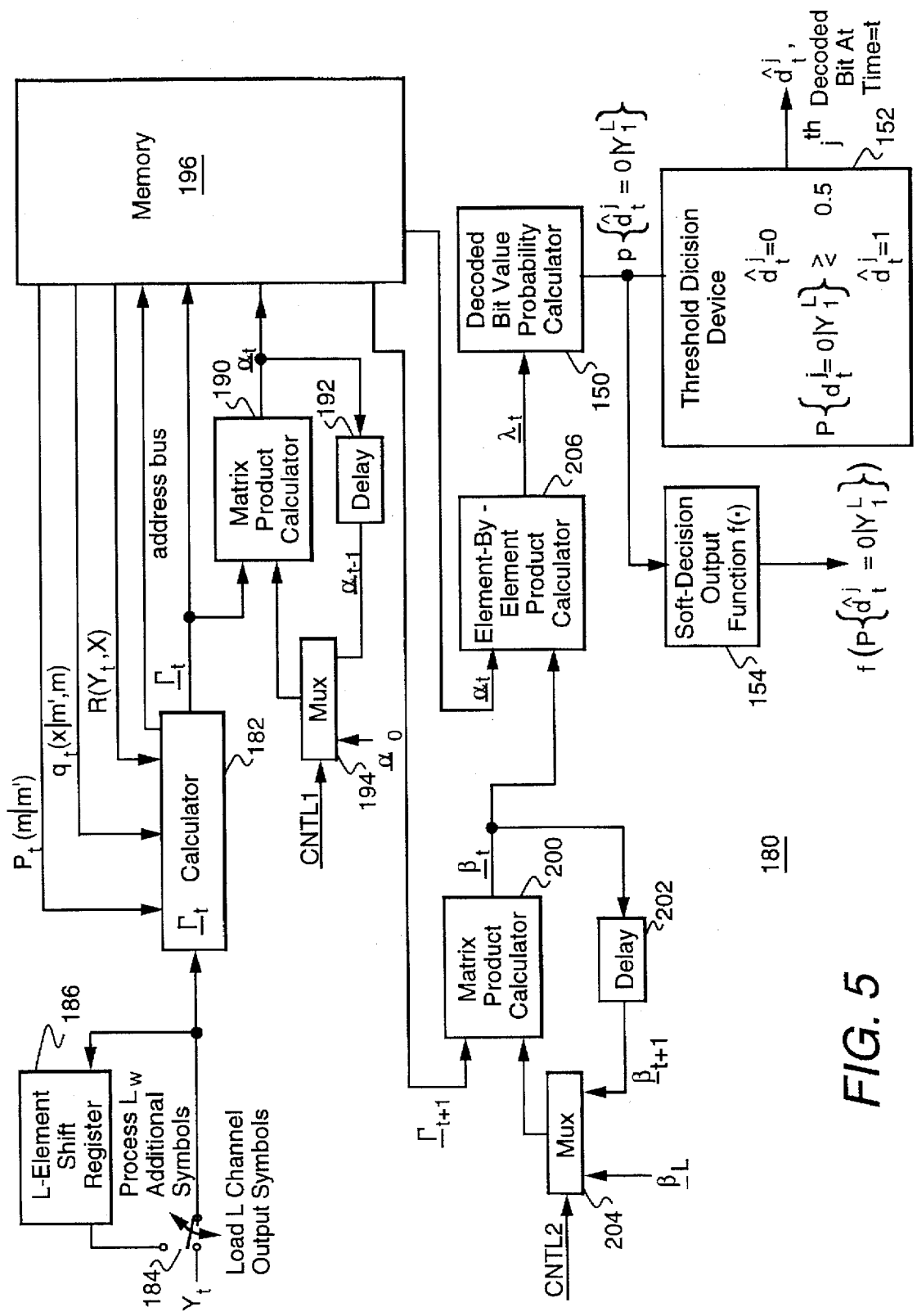
FIG. 5 is a simplified block diagram illustrating an alternative embodiment of a circular MAP decoder useful as a component decoder for a parallel concatenated convolutional coding scheme according to the present invention.

FIG. 5 is a simplified block diagram illustrating a circular MAP decoder 180 in accordance with this preferred embodiment of the present invention. Decoder 180 comprises a $\Gamma_t$ calculator 182 which calculates $\Gamma_t$ as a function of the channel output $y_t$. The channel outputs $y_1, ..., y_L$ are provided to the $\Gamma_t$ calculator via a switch 184. With the switch in the down position, L channel output symbols are loaded into a $\Gamma_t$ calculator 182 and a shift register 186 one at a time. Then, switch 184 is moved to the up position to allow the shift register to shift the first $L_w$ received symbols into the $\Gamma_t$ calculator again, i.e., to provide circular processing. The $\Gamma_t$ calculator receives as inputs from memory 130 the channel transition probability $R(Y_t, X)$, the probability $p_t(m/m')$ that the encoder makes a transition from state m' to m at time t, and the probability $q_t(X/m', m)$ that the encoder's output symbol is X given that the previous encoder state is m' and the present encoder state is m. The $\Gamma_t$ calculator calculates each element of $\Gamma_t$ by summing over all possible encoder outputs X in accordance with equation (2).

The calculated values of $\Gamma_t$ are provided to a matrix product calculator 190 which multiplies the $\Gamma_t$ matrix by the $\alpha_{t-1}$ matrix, which is provided recursively via a delay 192 and multiplexer 194 circuit. Control signal CNTRL1 causes multiplexer 194 to select $\alpha_0$ from memory 196 as one input to matrix product calculator 190 when t=1. When 2≤t≤L, control signal CNTRL1 causes multiplexer 194 to select $\alpha_{t-1}$ from delay 192 as one input to matrix product calculator 190. Values of $\Gamma_t$ and $\alpha_t$ are stored in memory 196 as required.

The $\beta_t$ vectors are calculated recursively in a matrix product calculator 200 via a delay 202 and multiplexer 204 circuit. Control signal CNTRL2 causes multiplexer 204 to select $\beta_L$ from memory 196 as one input to matrix product calculator 200 when t=L−1. When L−2≥t≥−1, control signal CNTRL2 causes multiplexer 204 to select $\beta_{t+1}$ from delay 102 as one input to matrix product calculator 200. The resulting values of $\beta_t$ are multiplied by the values of $\alpha_t$, obtained from memory 196, in an element-by-element product calculator 206 to provide the probabilities $\lambda_t$, as described hereinabove. In the same manner as described hereinabove with reference to FIG. 4, the values of $\lambda_t$ are provided to a decoded bit value probability calculator 150, the output of which is provided to a threshold decision device 152, resulting in the decoders decoded output bits.

The conditional probability that the decoded bit equals zero (P{$d_t^j$=0/$Y_t^L$}) is also shown in FIG. 5 as being provided to a soft output function block 154 for providing a function of the probability, i.e., f(P{$d_t^j$=0/$Y_t^L$}), such as, for example, the $$\text{likelihood ratio} = \frac{1 - P\{d_t^j = 0/Y_t^L\}}{P\{d_t^j = 0/Y_t^L\}}$$

as the decoder's soft-decision output. Another useful function of P{$d_t^j$=0/$Y_t^L$} is the $$\text{log likelihood ratio} = \log \left\{ \frac{1 - P\{d_t^j = 0/Y_t^L\}}{P\{d_t^j = 0/Y_t^L\}} \right\}.$$

Alternatively, a useful function for block 154 may simply be the identity function so that the soft output is just P{$d_t^j$=0/$Y_t^L$}.

In accordance with the present invention, it is possible to increase the rate of the parallel concatenated coding scheme comprising tail-biting nonrecursive systematic codes by deleting selected bits in the composite codeword formed by the composite codeword formatter according to an advantageously chosen pattern prior to transmitting the bits of the composite codeword over a channel. This technique is known as puncturing. This puncturing pattern is also known by the decoder. The following simple additional step performed by the received composite-codeword-to-component-codeword converter provides the desired decoder operation: the received composite-codeword-to-component-codeword converter merely inserts a neutral value for each known punctured bit during the formation of the received component codewords. For example, the neutral value is o for the case of antipodal signalling over an additive white Gaussian noise channel. The rest of the decoder's operation is as described hereinabove.

It has heretofore been widely accepted that nonrecursive systematic convolutional codes would not be useful as the component codes in a parallel concatenated coding scheme because of the superior distance properties of RSC codes for relatively large the data block lengths, as reported, for example in S. Benedetto and G. Montorsi, "Design of Parallel Concatenated Convolutional Codes," IEEE Transactions on Communications, to be published. However, as described hereinabove, the inventors have determined that the minimum distance of a NSC code is less sensitive to data block length and, therefore, can be used advantageously in communication systems that transmit short blocks of data bits in very noisy channels. In addition, the inventors have determined that the use of tail-biting codes solves the problem of termination of input data sequences in turbo codes. Use of tail-biting convolutional codes as component codes in a parallel concatenated coding scheme has not been proposed heretofore. Hence, the present invention provides a parallel concatenated nonrecursive tail-biting systematic convolutional coding scheme with a decoder comprising circular MAP decoders for decoding the component tail-biting convolutional codes to provide better performance for short data block lengths than in conventional turbo coding schemes, as measured in terms of bit error rate versus signal-to-noise ratio.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for parallel concatenated convolutional encoding, comprising the steps of:

providing a block of data bits to a parallel concatenated encoder comprising a plurality of N component encoders and N–1 interleavers connected in a parallel concatenation;

encoding the block of data bits in a first one of the component encoders by applying a tail-biting nonrecursive systematic convolutional code thereto and thereby generating a corresponding first component codeword comprising the data bits and parity bits;

interleaving the block of data bits to provide a permuted block of data bits;

encoding the resulting permuted block of data bits in a subsequent component encoder by applying a tail-biting nonrecursive systematic convolutional code thereto, and thereby generating a corresponding second component codeword comprising the data bits and parity bits;

repeating the steps of interleaving and encoding the resulting permuted block of data bits through the remaining N–2 interleavers and the remaining N–2 component encoders, and thereby generating component codewords comprising the data bits and parity bits; and formatting the bits of the component codewords to provide a composite codeword.

2. The method of claim 1 wherein the formatting step is performed such that the composite codeword includes only one occurrence of each bit in the block of data bits.

3. The method of claim 1 wherein the formatting step is performed such that the composite codeword includes only selected ones of the bits comprising the component codewords according to a predetermined pattern.

4. A method for decoding parallel concatenated convolutional codes, comprising the steps of:

receiving from a channel a composite codeword that comprises a formatted collection of bits from a plurality (N) of component codewords that have been generated by applying tail-biting nonrecursive systematic convolutional codes to a block of data bits in a parallel concatenated encoder, forming received component codewords from the received composite codeword, each respective received component codeword being received by a corresponding one of a plurality of N component decoders of a composite decoder, each respective component decoder also receiving a set of a priori soft-decision information for vales of the data bits;

decoding the received component codewords by a process of iterations through the N component decoders and N–1 interleavers to provide soft-decision outputs from the composite decoder, the N component decoders each providing soft-decision information on each data bit in the data block in the order encoded by the corresponding component encoder, the N–1 interleavers each interleaving the soft-decision information from a preceding component decoder to provide a permuted block of soft information to a subsequent component decoder, the set of a priori soft-decision information for the first of the N component decoders being calculated assuming that the data bits' values are equally likely for the first iteration and thereafter comprising a first function of the soft-decision information, which first function of the soft-decision information is fed back from the $N^{th}$ component decoder via a first deinterleaver comprising N–1 deinterleavers corresponding to the N–1 interleavers, the N–1 deinterleavers of the first deinterleaver being applied in reverse order to the N–1 interleavers, the set of a priori soft-decision information provided to each other component decoder comprising the first function of the soft-decision information from the previous sequential component decoder; and deinterleaving in a second deinterleaver to provide a second function of the soft-decision output from the $N^{th}$ component decoder as the composite decoder's soft-decision output using N–1 deinterleavers corresponding to the N–1 interleavers, the N–1 deinterleavers of the second deinterleaver being applied in reverse order to the N–1 interleavers.

5. The method of claim 4 wherein the number of iterations through the component decoders, interleavers and deinterleavers is a predetermined number.

6. The method of claim 4 wherein the iterations through the component decoders, interleavers and deinterleavers continues until decoder convergence is detected if the number of iterations is less than a maximum number; otherwise decoding terminates after the maximum number of iterations, and the composite decoder provides the second function of soft-decision outputs from the $N^{th}$ component decoder as its soft-decision output via the second deinterleaver.

7. The method of claim 4, further comprising the step of implementing a decision rule to provide hard-decision outputs as a function of the composite decoder's soft-decision output.

8. The method of claim 4 wherein the formatted collection of bits has been punctured according to a predetermined pattern, the method for decoding further comprising the step of inserting neutral values for all punctured bits when forming the received component codewords.

9. The method of claim 4 wherein the decoding step is performed by the N component decoders comprising circular MAP decoders, the decoding step comprising solving an eigenvector problem.

10. The method of claim 4 wherein the decoding step is performed by the N component decoders comprising circular MAP decoders, the decoding step comprising a recursion method.

11. A method for encoding and decoding parallel concatenated convolutional codes, comprising the steps of:

providing a block of data bits to a parallel concatenated encoder comprising a plurality of N component encoders and N−1 interleavers connected in a parallel concatenation;

encoding the block of data bits in a first one of the component encoders by applying a tail-biting nonrecursive systematic convolutional code thereto and thereby generating a corresponding first component codeword comprising the data bits and parity bits;

interleaving the block of data bits to provide a permuted block of data bits;

encoding the resulting permuted block of data bits in a subsequent component encoder by applying a tail-biting nonrecursive systematic convolutional code thereto and thereby generating a corresponding second component codeword comprising the data bits and parity bits;

repeating the steps of interleaving and encoding the resulting permuted block of data bits through the remaining N−2 interleavers and the remaining N−2 component encoders, and thereby generating component codewords comprising the data bits and parity bits;

formatting the bits of the component codewords to provide a composite codeword;

inputting the composite codeword to a channel;

receiving a received composite codeword from a channel;

forming received component codewords from the received composite codeword providing each respective received component codeword to a corresponding one of a plurality of N component decoders of a composite decoder, each respective component decoder also receiving a set of a priori probabilities for values of the data bits;

decoding the received component codewords by a process of iterations through the N component decoders and N−1 interleavers to provide soft-decision outputs from the composite decoder, the N component decoders each providing soft-decision information on each data bit in the data block in the order encoded by the corresponding component encoder, the N−1 interleavers each interleaving the soft-decision information from a preceding component decoder to provide a permuted block of soft information to a subsequent component decoder, the set of a priori soft-decision information for the first of the N component decoders being calculated assuming that the data bits' values are equally likely for the first iteration and thereafter comprising a first function of the soft-decision information, which first function of the soft-decision information is fed back from the $N^{th}$ decoder via a first deinterleaver comprising N−1 deinterleavers corresponding to the N−1 interleavers, the N−1 deinterleavers of the first deinterleaver being applied in reverse order to the N−1 interleavers, the set of a priori soft-decision information provided to each other component decoder comprising the first function of the soft-decision information from the previous sequential component decoder; and deinterleaving in a second deinterleaver to provide a second function of the soft-decision output from the $N^{th}$ component decoder as the composite decoder's soft-decision output using N−1 deinterleavers corresponding to the N−1 interleavers, the N−1 deinterleavers of the second deinterleaver being applied in reverse order to the N−1 interleavers.

12. The method of claim 11 wherein the formatting step is performed such that the composite codeword includes only one occurrence of each bit in the block of data bits.

13. The method of claim 11 wherein the formatting step is performed such that the composite codeword includes only selected ones of the bits comprising the component codewords according to a predetermined pattern.

14. The method of claim 11 wherein the ,number of iterations through the component decoders, interleavers and deinterleavers is a predetermined number.

15. The method of claim 11 wherein the iterations through the component decoders, N−1 interleavers and deinterleavers continues until decoder convergence is detected if the number of iterations is less than a maximum number; otherwise decoding terminates after the maximum number of iterations, and the composite decoder provides the second function of soft-decision outputs from the $N^{th}$ component decoder as its soft-decision output via the second deinterleaver.

16. The method of claim 11, further comprising the step of implementing a decision rule to provide hard-decision outputs as a function of the composite decoder's soft-decision output.

17. The method of claim 11 wherein the decoding step is performed by the N component decoders comprising circular MAP decoders, the decoding step comprising solving an eigenvector problem.

18. The method of claim 11 wherein the decoding step is performed by the N component decoders comprising circular MAP decoders, the decoding step comprising a recursion method.

19. The method of claim 11 wherein the formatting step further comprises puncturing selected ones of the bits from the component codewords which comprise the composite codeword according to a predetermined pattern, the method for decoding further comprising the step of inserting neutral values for all punctured bits when forming the received component codewords.

20. A parallel concatenated encoder, comprising:

a plurality (N) of component encoders and a plurality (N−1) of interleavers connected in a parallel concatenation for systematically applying tail-biting nonrecursive systematic convolutional codes to a block of data bits and various permutations of the block of data bits, and thereby generating component codewords comprising the data bits and parity bits; and a composite codeword formatter for formatting the collection of bits from the component codewords to provide a composite codeword.

21. The encoder of claim 20 wherein the composite codeword formatter produces the composite codeword such that it includes only one occurrence of each bit in the block of data bits.

22. The encoder of claim 20 wherein the composite codeword produces the composite codeword such that it includes only selected ones of the bits comprising the component codewords according to a predetermined pattern.

23. A composite decoder for decoding parallel concatenated convolutional codes, comprising:

a composite-codeword-to-component-codeword converter for receiving a composite codeword from a channel, the composite codeword comprising selected bits of a plurality of N component codewords that have been generated by applying tail-biting nonrecursive convolutional codes to a block of data bits in a parallel concatenated encoder, and forming a plurality of N corresponding received component codewords therefrom;

a plurality (N) of component decoders, each respective decoder receiving a corresponding received component codeword from the composite-codeword-to-component-codeword converter, each respective decoder also receiving a set of a priori soft-decision information for values of the data bits, the N component decoders each providing soft-decision information on each data bit in the data block in the order encoded by a corresponding component encoder in the parallel concatenated encoder;

a plurality of N−1 interleavers, each respective interleaver interleaving the soft-decision information from a corresponding component decoder to provide a permuted block of soft information to a subsequent component decoder, the received codewords being decoded by a process of iterations through the N component decoders and N−1 interleavers to provide soft-decision output from the composite decoder;, a first deinterleaver comprising N−1 deinterleavers corresponding to the N−1 interleavers, the N−1 deinterleavers of the first deinterleaver being applied in reverse order to the N−1 interleavers, the set of a priori soft-decision information for the first of the N component decoders being calculated assuming that the data bits' values are equally likely for the first iteration and thereafter comprising a first function of the soft-decision information, which first function of the soft-decision information is outputted by the $N^{th}$ decoder and fed back via the first deinterleaver, the set of a priori soft-decision information provided to each other component decoder comprising the first function of the soft-decision information from the previous sequential component decoder; and a second deinterleaver comprising N−1 deinterleavers corresponding to the N−1 interleavers, the N−1 deinterleavers of the second deinterleaver being applied in reverse order to the N−1 interleavers, the second deinterleaver deinterleaving a second function of the soft-decision output from the $N^{th}$ component decoder to provide the composite decoder's soft-decision output.

24. The decoder of claim 23 wherein the number of iterations through the component decoders, interleavers and deinterleavers is a predetermined number.

25. The decoder of claim 23 wherein the iterations through the component decoders, interleavers and deinterleavers continues until decoder convergence is detected if the number of iterations is less than a maximum number; otherwise decoding terminates after the maximum number of iterations, and the composite decoder provides the second function of soft-decision outputs from the $N^{th}$ component decoder as its soft-decision output via the second deinterleaver.

26. The decoder of claim 23, further comprising a decision device for implementing a decision rule to provide hard-decision outputs as a function of the composite decoder's soft-decision output.

27. The decoder of claim 23 wherein the N component decoders comprise circular MAP decoders which decode by solving an eigenvector problem.

28. The decoder of claim 23 wherein the N component decoders comprise circular MAP decoders which decode by using a recursion method.

29. An encoder and decoder system for encoding and decoding parallel concatenated convolutional codes, comprising:

a parallel concatenated encoder comprising a plurality (N) of component encoders and a plurality (N−1) of encoder interleavers connected in a parallel concatenation for systematically applying tail-biting nonrecursive systematic convolutional codes to a block of data bits and various permutations of the block of data bits, and thereby generating component codewords comprising the data bits and parity bits; and a composite codeword formatter for formatting the collection of bits from the component codewords to provide a composite codeword;

a composite-codeword-to-component-codeword converter for receiving the composite codeword from a channel and forming a plurality of N corresponding received component codewords therefrom;

a plurality (N) of component decoders, each respective decoder receiving a corresponding received component codeword from the composite-codeword-to-component-codeword converter, each respective decoder also receiving a set of a priori soft-decision information for values of the data bits, the N component decoders each providing soft-decision information on each data bit in the data block in the order encoded by a corresponding component encoder in the parallel concatenated encoder;

a plurality of N−1 interleavers, each respective interleaver interleaving the soft-decision information from a corresponding component decoder to provide a permuted block of soft information to a subsequent component decoder, the received codewords being decoded by a process of iterations through the N component decoders and N−1 interleavers to provide soft-decision output from the composite decoder;

a first deinterleaver comprising N−1 deinterleavers corresponding to the N−1 interleavers, the N−1 deinterleavers of the first deinterleaver being applied in reverse order to the N−1 interleavers, the set of a priori soft-decision information for the first of the N component decoders being calculated assuming that the data bits' values are equally likely for the first iteration and thereafter comprising a first function of the soft-decision information, which first function of the soft-decision information is outputted by the $N^{th}$ decoder and fed back via the first deinterleaver, the set of a priori soft-decision information provided to each other component decoder comprising the first function of the soft-decision information from the previous sequential component decoder; and a second deinterleaver comprising N–1 deinterleavers corresponding to the N–1 interleavers, the N–1 deinterleavers of the second deinterleaver being applied in reverse order to the N–1 interleavers, the second deinterleaver deinterleaving a second function of the soft-decision output from the $N^{th}$ component decoder to provide the composite decoder's soft-decision output.

30. The encoder and decoder system of claim 29 wherein the composite codeword formatter produces the composite codeword such that it includes only one occurrence of each bit in the block of data bits.

31. The encoder and decoder system of claim 29 wherein the composite codeword produces the composite codeword such that it includes only selected ones of the bits comprising the component codewords according to a predetermined pattern.

32. The encoder and decoder system of claim 29 wherein the number of iterations through the component decoders, interleavers and deinterleavers is a predetermined number.

33. The encoder and decoder system of claim 29 wherein the iterations through the component decoders, interleavers and deinterleavers continues until decoder convergence is detected if the number of iterations is less than a maximum number; otherwise decoding terminates after the maximum number of iterations, and the composite decoder provides the second function of soft-decision outputs from the $N^{th}$ component decoder as its soft-decision output via the second deinterleaver.

34. The encoder and decoder system of claim 29, further comprising a decision device for implementing a decision role to provide hard-decision outputs as a function of the decoders soft-decision output.

35. The encoder and decoder system of claim 29 wherein the N component decoders comprise circular MAP decoders which decode by solving an eigenvector problem.

36. The encoder and decoder system of claim 29 wherein the N component decoders comprise circular MAP decoders which decode by using a recursion method.

* * * * *